(12) United States Patent
Ney

(10) Patent No.: US 11,306,519 B2
(45) Date of Patent: Apr. 19, 2022

(54) METAL TRACES FOR HALL-EFFECT SENSOR ACTIVATION IN A VEHICLE LATCH

(71) Applicant: Inteva Products, LLC, Troy, MI (US)

(72) Inventor: Daniel Alexander Ney, Lake Orion, MI (US)

(73) Assignee: INTEVA PRODUCTS, LLC, Troy, MI (US)

( * ) Notice: Subject to any disclaimer, the term of this patent is extended or adjusted under 35 U.S.C. 154(b) by 0 days.

(21) Appl. No.: 16/852,451

(22) Filed: Apr. 18, 2020

(65) Prior Publication Data

US 2020/0332572 A1 Oct. 22, 2020

Related U.S. Application Data

(60) Provisional application No. 62/836,396, filed on Apr. 19, 2019.

(51) Int. Cl.
*E05B 81/64* (2014.01)
*G01D 5/14* (2006.01)
*H03K 17/97* (2006.01)

(52) U.S. Cl.
CPC ............ *E05B 81/64* (2013.01); *G01D 5/145* (2013.01)

(58) Field of Classification Search
CPC ........ E05B 81/64; G01D 5/145; G01D 5/147; G01D 5/20
USPC ....................................................... 324/207.2
See application file for complete search history.

(56) References Cited

U.S. PATENT DOCUMENTS

| 4,994,739 | A | * | 2/1991 | Honda | G01P 1/026 |
| | | | | | 324/173 |
| 5,240,296 | A | * | 8/1993 | Kobayashi | E05B 81/25 |
| | | | | | 200/61.62 |
| 5,270,645 | A | * | 12/1993 | Wheeler | G01D 5/147 |
| | | | | | 123/376 |
| 5,516,164 | A | * | 5/1996 | Kobayashi | E05B 81/20 |
| | | | | | 292/201 |
| 5,627,465 | A | * | 5/1997 | Alfors | G01B 7/30 |
| | | | | | 324/202 |
| 5,694,039 | A | * | 12/1997 | Alfors | G01B 7/30 |
| | | | | | 324/207.12 |
| 5,719,496 | A | * | 2/1998 | Wolf | G01D 5/147 |
| | | | | | 324/165 |

(Continued)

FOREIGN PATENT DOCUMENTS

| DE | 19505759 A1 * | 9/1996 | ............ E05B 17/22 |
| DE | 29618688 U1 | 2/1997 | |

(Continued)

OTHER PUBLICATIONS

International Search Report for Application No. PCT/US2020/028885.
Written Opinion for Application No. PCT/US2020/028885.

*Primary Examiner* — Carlos Lugo
(74) *Attorney, Agent, or Firm* — Cantor Colburn LLP

(57) ABSTRACT

A latch assembly, including: at least one moveable component rotationally mounted to the latch assembly; a magnet secured to the at least one moveable component; a hall effect sensor remote from the magnet; and a metal trace operably coupled to the hall effect sensor and configured to be magnetized by the magnet as the at least one moveable component rotates.

13 Claims, 13 Drawing Sheets

(56) References Cited

U.S. PATENT DOCUMENTS

| | | | | |
|---|---|---|---|---|
| 5,722,706 | A * | 3/1998 | Bartel | E05B 85/045 |
| | | | | 200/61.64 |
| 5,765,884 | A * | 6/1998 | Armbruster | E05B 81/20 |
| | | | | 292/1 |
| 5,811,968 | A * | 9/1998 | Nakazawa | G01D 5/145 |
| | | | | 123/617 |
| 5,862,691 | A * | 1/1999 | Friedrich | E05B 17/22 |
| | | | | 70/264 |
| 5,889,400 | A * | 3/1999 | Nakazawa | G01D 5/145 |
| | | | | 324/207.2 |
| 5,890,384 | A | 4/1999 | Bartel et al. | |
| 6,304,078 | B1 * | 10/2001 | Jarrard | G01B 7/003 |
| | | | | 324/207.2 |
| 6,373,241 | B1 * | 4/2002 | Weber | G01D 5/145 |
| | | | | 310/68 B |
| 6,577,119 | B1 * | 6/2003 | Yaddehige | G01D 5/145 |
| | | | | 324/207.2 |
| 7,009,388 | B2 * | 3/2006 | Johnson | G01D 5/145 |
| | | | | 324/207.24 |
| 7,026,897 | B2 * | 4/2006 | Lamb | E05B 85/26 |
| | | | | 335/205 |
| 7,841,231 | B2 * | 11/2010 | Kang | B62D 15/0215 |
| | | | | 73/117.02 |
| 7,916,489 | B2 * | 3/2011 | Okuya | G01D 5/145 |
| | | | | 361/752 |
| 8,222,889 | B2 * | 7/2012 | Oberhoffner | G01D 3/0365 |
| | | | | 324/207.13 |
| 8,314,607 | B2 * | 11/2012 | Tanaka | G01D 5/145 |
| | | | | 324/207.13 |
| 8,624,586 | B2 * | 1/2014 | Dordet | G01D 5/145 |
| | | | | 324/207.2 |
| 9,018,942 | B2 * | 4/2015 | Stanley | G01R 33/07 |
| | | | | 324/207.2 |
| 10,199,567 | B2 * | 2/2019 | Itou | H01L 43/065 |
| 10,816,365 | B2 * | 10/2020 | Mirassou | G01D 18/002 |
| 2004/0118666 | A1 * | 6/2004 | McCaig | E05B 81/66 |
| | | | | 200/38 F |
| 2005/0001437 | A1 * | 1/2005 | Brose | E05B 85/26 |
| | | | | 292/216 |
| 2007/0126577 | A1 * | 6/2007 | Cervantes | E05B 85/24 |
| | | | | 340/547 |
| 2008/0066548 | A1 * | 3/2008 | Jajtic | H02K 41/0356 |
| | | | | 73/514.39 |
| 2009/0284253 | A1 * | 11/2009 | Finkler | G01D 5/147 |
| | | | | 324/207.2 |
| 2011/0254291 | A1 * | 10/2011 | Rhein | E05B 81/76 |
| | | | | 292/336.3 |
| 2013/0305843 | A1 * | 11/2013 | Lee | G01B 7/30 |
| | | | | 73/862.325 |
| 2014/0306692 | A1 * | 10/2014 | Santos | G01D 5/24461 |
| | | | | 324/207.2 |
| 2015/0137798 | A1 * | 5/2015 | Tanaka | B62K 11/04 |
| | | | | 324/207.2 |
| 2017/0275930 | A1 * | 9/2017 | Aerts | E05B 81/76 |
| 2018/0102473 | A1 * | 4/2018 | Itou | G01D 5/24428 |
| 2018/0298636 | A1 | 10/2018 | Minnich et al. | |
| 2018/0356256 | A1 * | 12/2018 | Mirassou | G01D 18/002 |

FOREIGN PATENT DOCUMENTS

| | | | | |
|---|---|---|---|---|
| DE | 19702206 | A1 * | 2/1998 | ............ E05B 17/22 |
| DE | 10065100 | A1 * | 7/2002 | ............ E05B 81/66 |
| DE | 102006011207 | A1 * | 9/2007 | ............ G01D 3/02 |
| DE | 112016001734 | | 1/2018 | |
| EP | 2716509 | B1 | 12/2016 | |
| FR | 2767349 | A1 * | 2/1999 | ............ E05B 81/66 |
| FR | 2778939 | A1 * | 11/1999 | ............ E05B 81/68 |
| SU | 499591 | A1 | 4/1976 | |
| WO | WO-2006060972 | A1 * | 6/2006 | ............ E05B 81/34 |
| WO | 2014037478 | A1 | 3/2014 | |

* cited by examiner

METAL TRACES FOR HALL-EFFECT SENSOR ACTIVATION IN A VEHICLE LATCH

CROSS REFERENCE TO RELATED APPLICATIONS

This application claims priority to the following U.S. Provisional Patent Application Ser. No. 62/836,396 filed on Apr. 19, 2019 the contents of which are incorporated herein by reference thereto.

BACKGROUND

Exemplary embodiments of the present disclosure pertain to hall-effect sensors and their use in vehicle latches.

Hall-effect sensors are becoming increasingly popular in latching systems. A hall-effect sensor is activated depending on the magnetic field strength that is reads. For latching applications, it is imperative that the controller knows a position of the components inside the latch accurately. Using a traditional hall effects arrangement, the magnet is positioned with its polarity perpendicular to the sensor. Since the magnetic field strength is not consistent at different air gap sizes (the perpendicular distance between the magnet and sensor), the magnet may activate at different horizontal positions based on the present air gap. This means that extra tight tolerances must be held in these zones, and that the sensor will not be directly over the position where it needs to be activated, but instead at the offset position, where the proper magnetic field strength is, which further makes development and tolerances difficult to design. The second down side, is the size of the printed circuit board PCB required for these when detecting multiple levers, or when the connector is at a location far away from the sensors. The larger the PCB, the larger the cost of the part is. This can also be problematic when the hall-effect sensors need to go onto different planes, as the electric circuit carrier ECC would need to bend, or additional levers may be required to get the proper sensor activation points.

BRIEF DESCRIPTION

A latching system with a hall-effect sensor as described herein.

Disclosed is a latch assembly, including: at least one moveable component rotationally mounted to the latch assembly; a magnet secured to the at least one moveable component; a hall effect sensor remote from the magnet; and a metal trace operably coupled to the hall effect sensor and configured to be magnetized by the magnet as the at least one moveable movable component rotates.

In addition to one or more of the features described above, or as an alternative to any of the foregoing embodiments, the metal trace has multiple activation points to be magnetized by the magnet.

In addition to one or more of the features described above, or as an alternative to any of the foregoing embodiments, the hall effect sensor is secured to a printed circuit board.

In addition to one or more of the features described above, or as an alternative to any of the foregoing embodiments, further including a connector secured to the printed circuit board.

In addition to one or more of the features described above, or as an alternative to any of the foregoing embodiments, the hall effect sensor is a first hall effect sensor and the metal trace is a first metal trace and the latch assembly further comprises a second hall effect sensor and a second metal trace operably coupled to the second hall effect sensor, wherein the first metal trace and the second metal trace are each configured to be magnetized separately by the magnet as the least one moveable component rotates.

In addition to one or more of the features described above, or as an alternative to any of the foregoing embodiments, the first hall effect sensor and the second hall effect sensor are secured to a printed circuit board.

In addition to one or more of the features described above, or as an alternative to any of the foregoing embodiments, further including a connector secured to the printed circuit board.

In addition to one or more of the features described above, or as an alternative to any of the foregoing embodiments, a pole of the magnet is horizontal to the metal trace.

In addition to one or more of the features described above, or as an alternative to any of the foregoing embodiments, a pole of the magnet is perpendicular to the metal trace.

In addition to one or more of the features described above, or as an alternative to any of the foregoing embodiments, the metal trace is curved.

In addition to one or more of the features described above, or as an alternative to any of the foregoing embodiments, the magnet is a single magnet and the metal trace is configured to be magnetized at multiple discrete activation points by the single magnet.

Also disclosed is a method for detecting movement of a latch assembly, including: rotationally mounting at least one moveable component to the latch assembly; securing a magnet to the at least one moveable component; and magnetizing a metal trace operably coupled to a hall effect sensor, the metal trace configured to be magnetized by the magnet as the at least one moveable component rotates.

In addition to one or more of the features described above, or as an alternative to any of the foregoing embodiments, the metal trace has multiple activation points to be magnetized by the magnet.

In addition to one or more of the features described above, or as an alternative to any of the foregoing embodiments, the hall effect sensor is secured to a printed circuit board.

In addition to one or more of the features described above, or as an alternative to any of the foregoing embodiments, further including a connector secured to the printed circuit board.

In addition to one or more of the features described above, or as an alternative to any of the foregoing embodiments, the hall effect sensor is a first hall effect sensor and the metal trace is a first metal trace and the latch assembly further comprises a second hall effect sensor and a second metal trace operably coupled to the second hall effect sensor, wherein the first metal trace and the second metal trace are each configured to be magnetized separately by the magnet as the least one moveable component rotates.

In addition to one or more of the features described above, or as an alternative to any of the foregoing embodiments, the first hall effect sensor and the second hall effect sensor are secured to a printed circuit board.

In addition to one or more of the features described above, or as an alternative to any of the foregoing embodiments, further including a connector secured to the printed circuit board.

In addition to one or more of the features described above, or as an alternative to any of the foregoing embodiments, a pole of the magnet is horizontal to the metal trace.

In addition to one or more of the features described above, or as an alternative to any of the foregoing embodiments, a pole of the magnet is perpendicular to the metal trace.

BRIEF DESCRIPTION OF THE DRAWINGS

The following descriptions should not be considered limiting in any way. With reference to the accompanying drawings, like elements are numbered alike.

The attached FIGS. illustrate various view of a hall-effect sensor for use in a latching system.

DETAILED DESCRIPTION

A detailed description of one or more embodiments of the disclosed apparatus and method are presented herein by way of exemplification and not limitation with reference to the Figures.

The present disclosure allows for a more versatile and cost effective way of activating hall-effect sensors that are used to detect lever position. Stamped ferrous metal traces can be used to transfer the magnetic field of the magnet to a hall-effect sensor that is located elsewhere. The set up for this design is to have one part of a steel trace run over or on top of the magnet for a portion of its travel, and at the other end of the trace have a hall effect sensor over it for detecting the magnetic field. Once the magnet becomes close to the metal trace, its magnetic field will magnetize the entire trace, and in turn activate the sensor.

First, the hall-effect sensors are able to be populated near each other and also close to the connector, since the traces can be routed however necessary in order to get the activation required. This allows for a smaller printed circuit board PCB design. Second, a traditional digital hall-effect sensor will only turn on or off at the point that the magnet is within range of the sensor. Using the stamped traces, the traces can be designed to activate the sensor at any point of the levers travel, and can also be activated at multiple points during its travel. Third, levers that are on different planes, with either height variation or different angles, can also be detected using just a single flat PCB. This can be achieved by bending the traces however needed, in order to get the magnetic field to transition from the lever to the PCB. Fourth, due to the phenomena of metals remaining magnetized after it has been in magnetized for an extended period of time, there are ways to remove the residual magnetization from the traces. By orienting the magnets horizontal (the polarity of the magnet is horizontal instead of perpendicular to the trace), this design can allow for the north polarity of the magnet to magnetize the trace, and when it rotates away, the south polarity can be used to demagnetize the trace (in other words, put the opposite magnetic field into the trace, which will turn the hall-effect sensor off since it is designed to only look for 1 polarity).

The traces may and in some embodiments will always be overmolded with plastic in order to keep environment factors from affecting them, and to also accurately position them in the assembly. This application can be used for lever position (radial or linear), gear position, or to detect the change of position for any component in the system (i.e. not limited to just the type of set up shown). Certain hall-effect sensors can detect both N and S polarity (i.e. ON North, ON South, OFF no magnetic field), therefore this concept can be used to provide more than just a digital ON/OFF signal, and can provide a 0, 1, or 2 reading in some instances.

Figure 1:
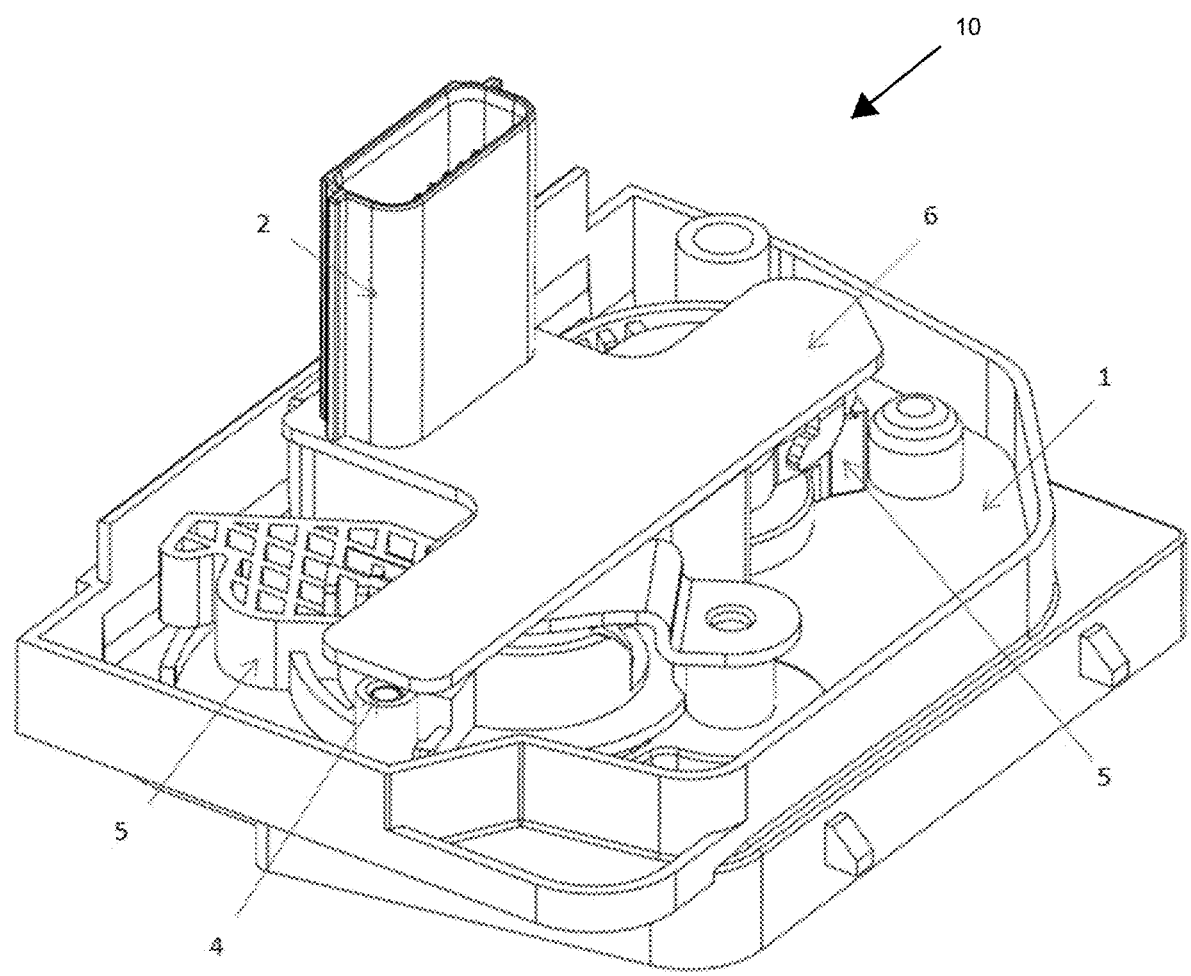
FIGS. 1-3 illustrates a latch assembly without metal traces.
Figure 2:
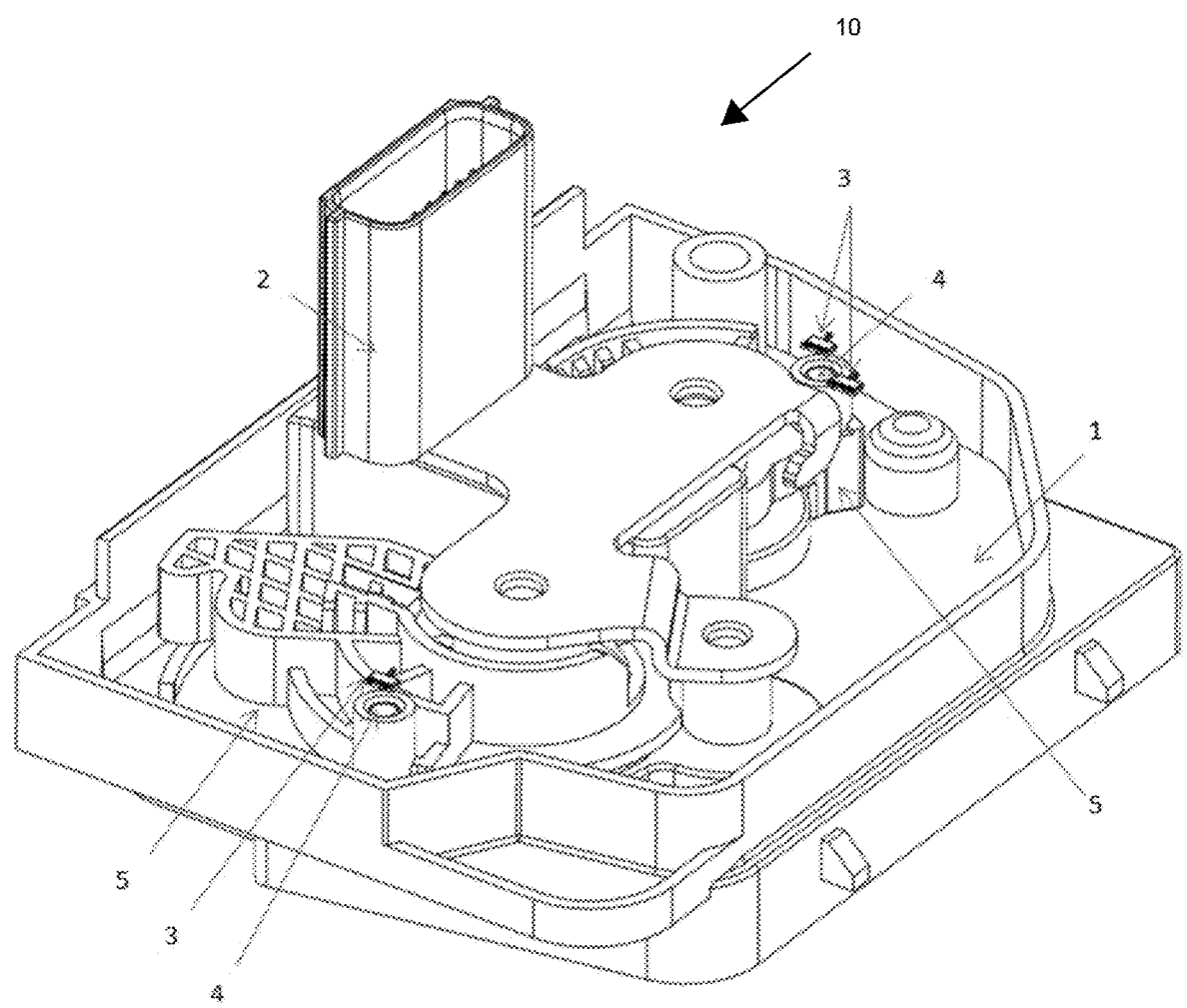
Figure 3:
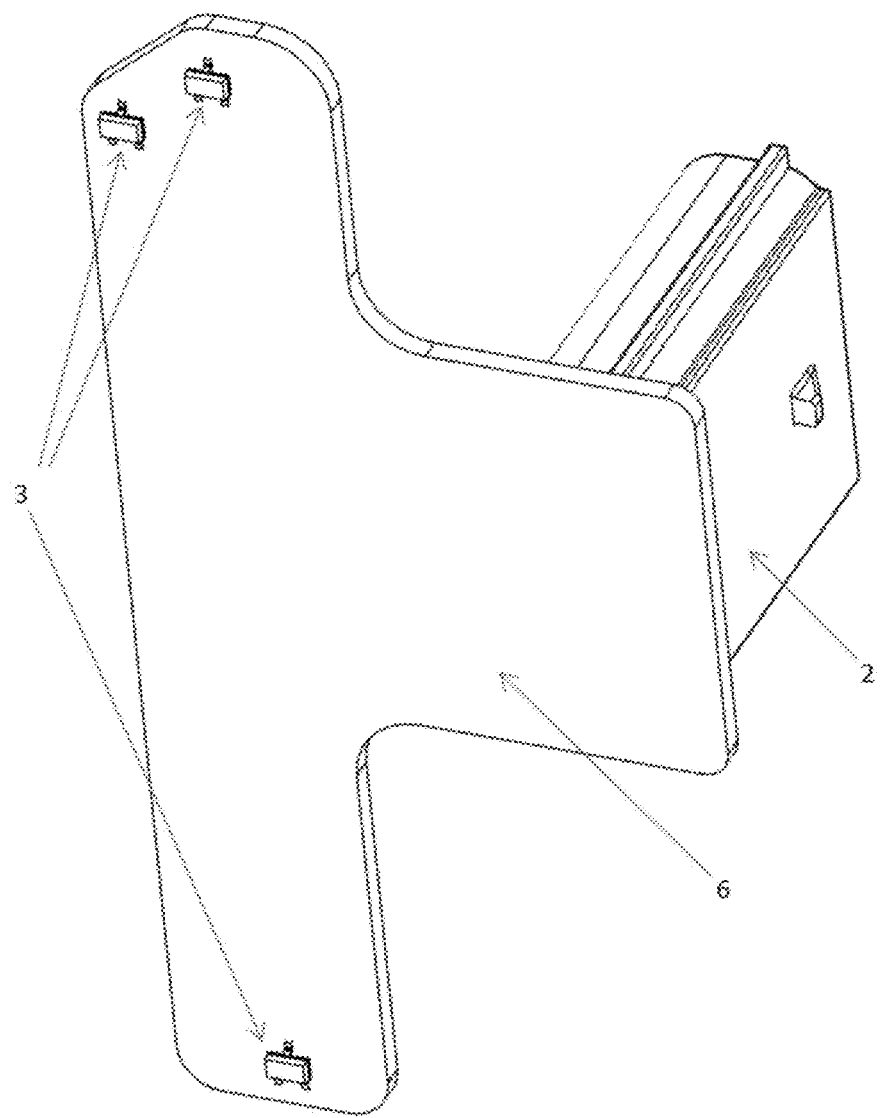

FIGS. 1-3 show a latch assembly 10 with hall-effect sensors. The printed circuit board PCB 6 has a connector 2 and hall-effect sensors 3 (illustrated in FIG. 2 and FIG. 3) mounted to it. Two moveable levers 5 of the latch assembly are rotatably mounted thereto and have magnets 4 fitting to them that are used to activate the sensors as they rotate and pass by underneath the hall-effect sensors 3.

FIG. 2 shows the latch assembly 20 with the hall-effect sensors 3. The printed circuit board PCB 6 has a connector 2 and the hall-effect sensors 3 mounted to it. The two levers 5 have magnets 4 fitted to them that are used to activate the sensors as they pass by underneath.

FIG. 3 shows the printed circuit board PCB 6 with the hall-effect sensors 3. The printed circuit board PCB 6 has the connector 2 and the hall-effect sensors 3 mounted to it. In FIGS. 1-3, The size of the printed circuit board PCB is due to the required locations for the magnets 4 in the latch assembly 20.

Figure 4:
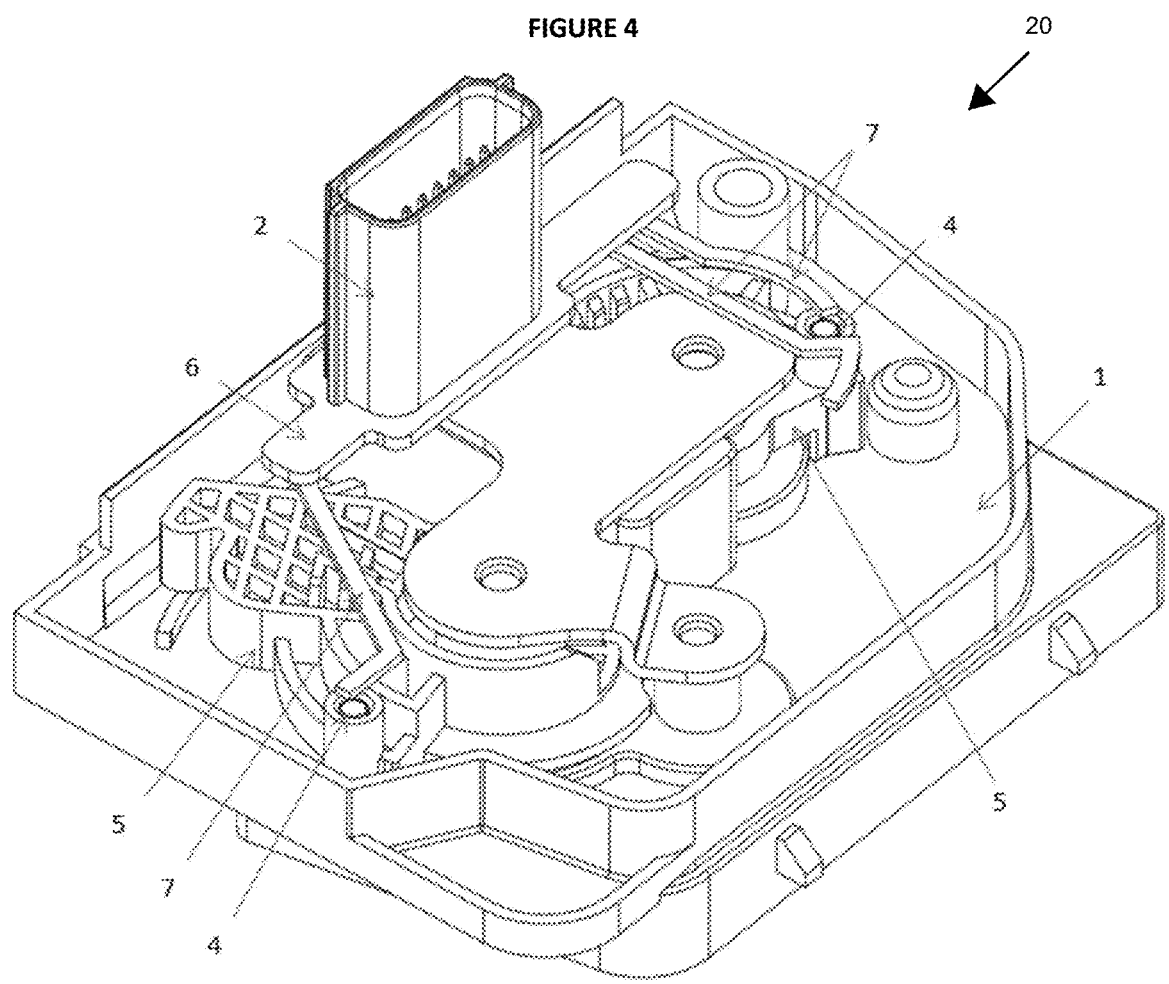
FIGS. 4-13B illustrate a latch assembly with hall effect sensors and metal traces in accordance with the present disclosure.

FIG. 4 shows a metal trace design for activating the hall-effect sensors 3. In one embodiment, the metal traces may be stamped ferrous metal traces or steel traces. The latch assembly 20 is similar to the latch assembly 10 illustrated in FIGS. 1-3 however, the printed circuit board PCB 6 is much smaller due to the use of a plurality of metal traces 7. The printed circuit board PCB 6 has a connector 2 and hall-effect sensors 3 (see at least FIGS. 5 and 6) mounted to it. The metal traces 7 act as bridges for transferring the magnetic field from the magnet to the hall-effect sensors 3. Two levers 5 are rotatably mounted to the latch assembly 20 and have magnets 4 fitting to them that are used to activate the sensors, by transferring their magnetic fields to the traces as they pass by underneath during their rotational movement. Although, two levers are illustrated the present disclosure is contemplated for use with more than two levers or movable components or less that two levers or moveable components (e.g., one lever or component). In other words, at least one moveable component is rotationally mounted to rotationally mounted to the latch assembly.

Figure 5:
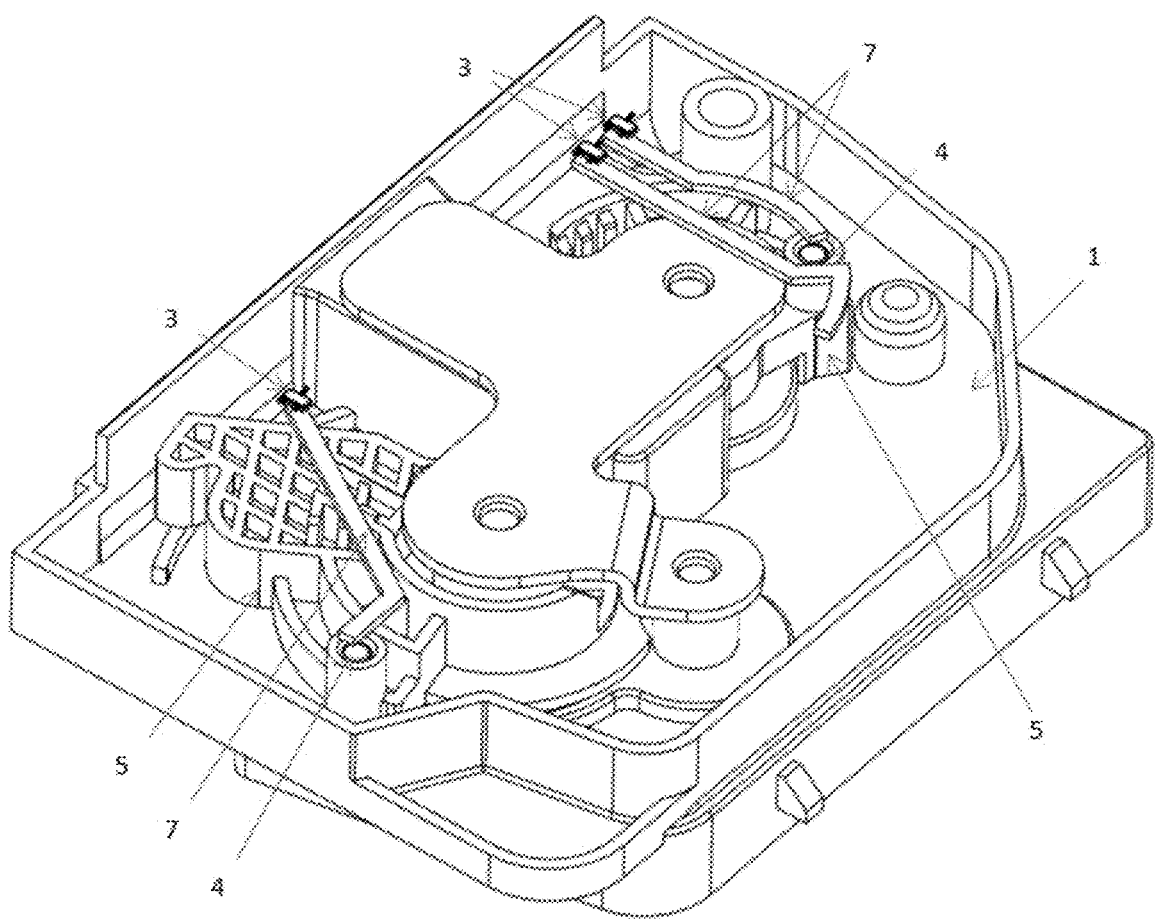

FIG. 5 shows a latch assembly 20 with hall-effect sensors 3. The PCB 6 has the connector 2 and hall-effect sensors 3 mounted to it. The metal traces 7 act as bridges for transferring the magnetic field from the magnet to the hall-effect sensors 3. As illustrated, the two levers 5 have magnets 4 fitting to them that are used to activate the sensors 3, by transferring their magnetic fields to the traces 7 as they pass by underneath.

Figure 6:
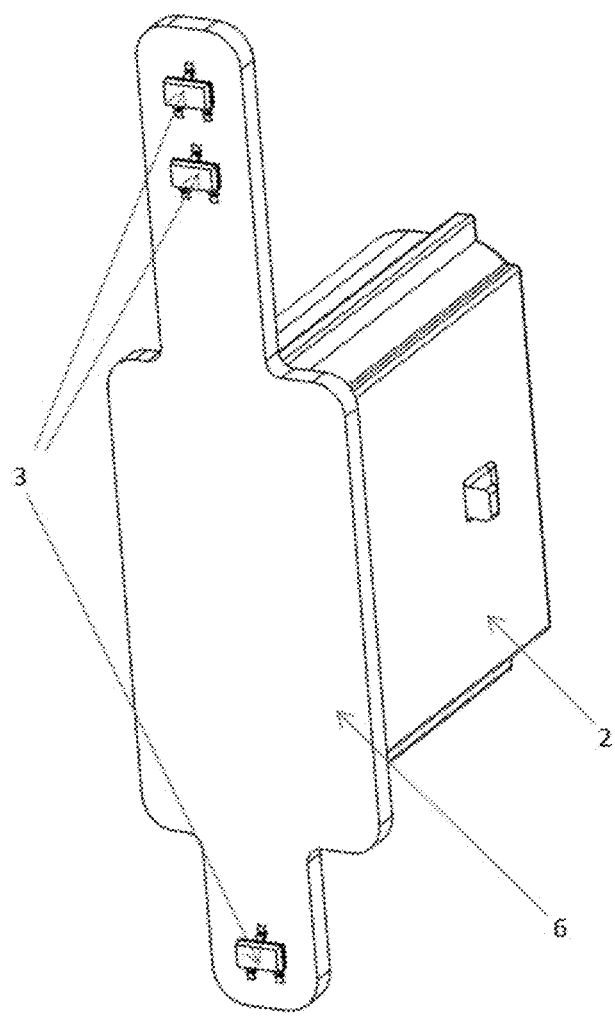

FIG. 6 shows a design for the printed circuit board PCB 6 with the hall-effect sensors 3 when the metal traces 7 have been utilized. The PCB 6 has the connector 2 and the hall-effect sensors 3 mounted to it. The size of the printed circuit board PCB 6 is minimized due to the traces 7 being routed to be closer to the connector 2. As such, the hall-effect sensors 3 are located remote from the movement of the magnets 4. This allows the printed circuit board 6 to have a smaller footprint and the hall-effect sensors 3 can be to mounted closer to the connector 2 thereby reducing the cost of the printed circuit board 6.

Figure 7:
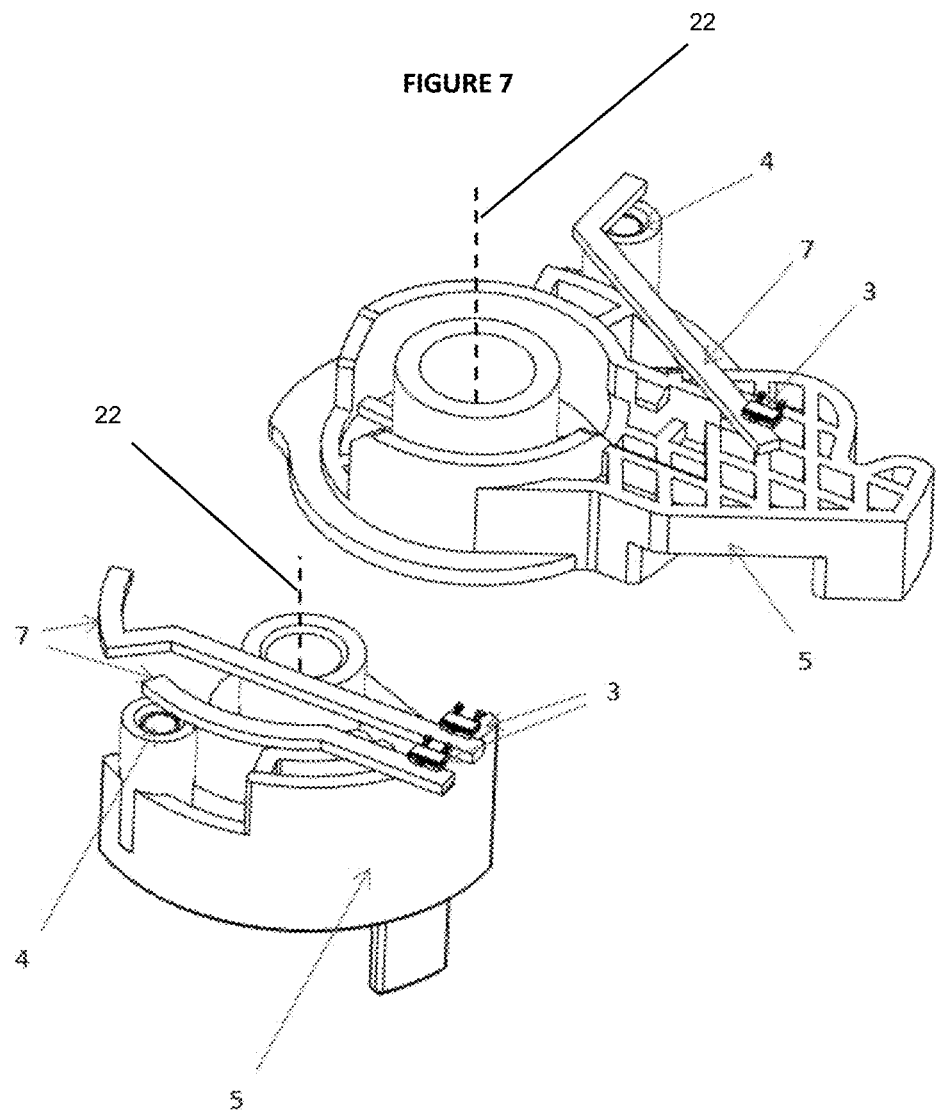

FIG. 7 shows the correlation between the metal traces 7, the hall-effect sensors 3, the magnets 4 and the levers 5. The magnet 4 transfers its magnetic field to the metal traces 7, which then can activate the hall-effect sensors 3. As shown, a single magnet 4 and lever 5 can be capable of activating multiple hall-effect sensors 3 based on how the metal traces 7 are arranged.

Figure 8:
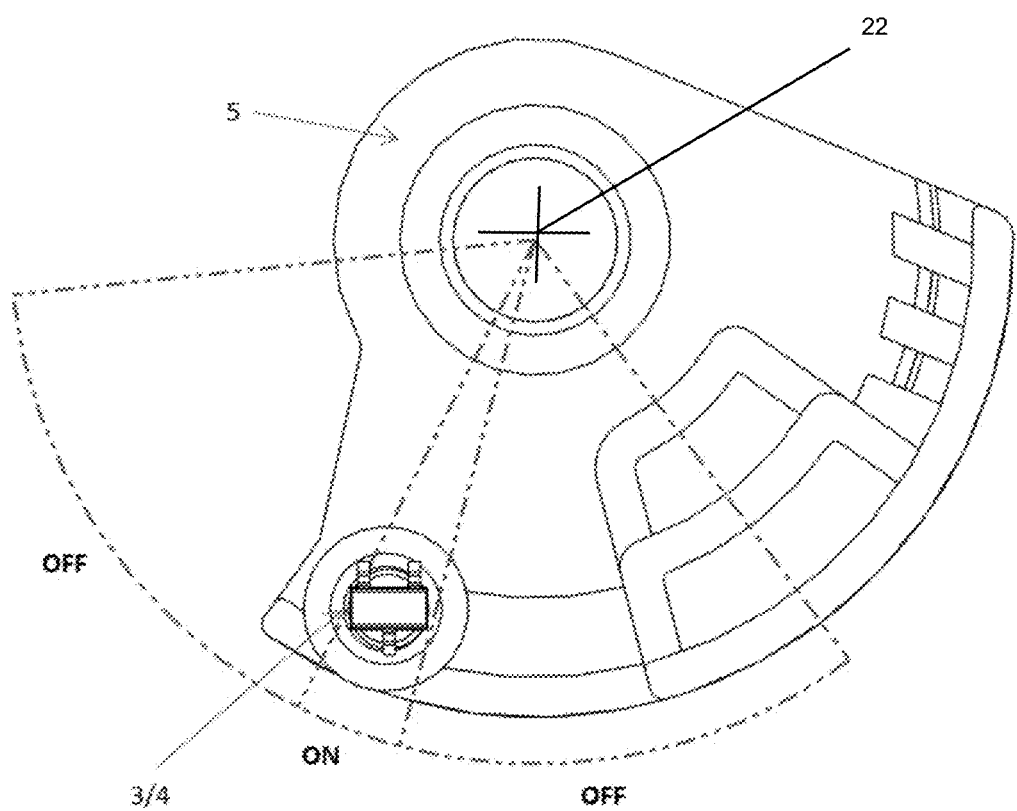

FIG. 8 shows the relationship between the hall-effect sensor 3, the magnets 4 and the levers 5 in a design without metal traces and how that correlates to the signals the controller sees as the lever 5 rotates about an axis 22. The magnet 4 activates the hall-effect sensor 3 anytime it is underneath it.

Figure 9:
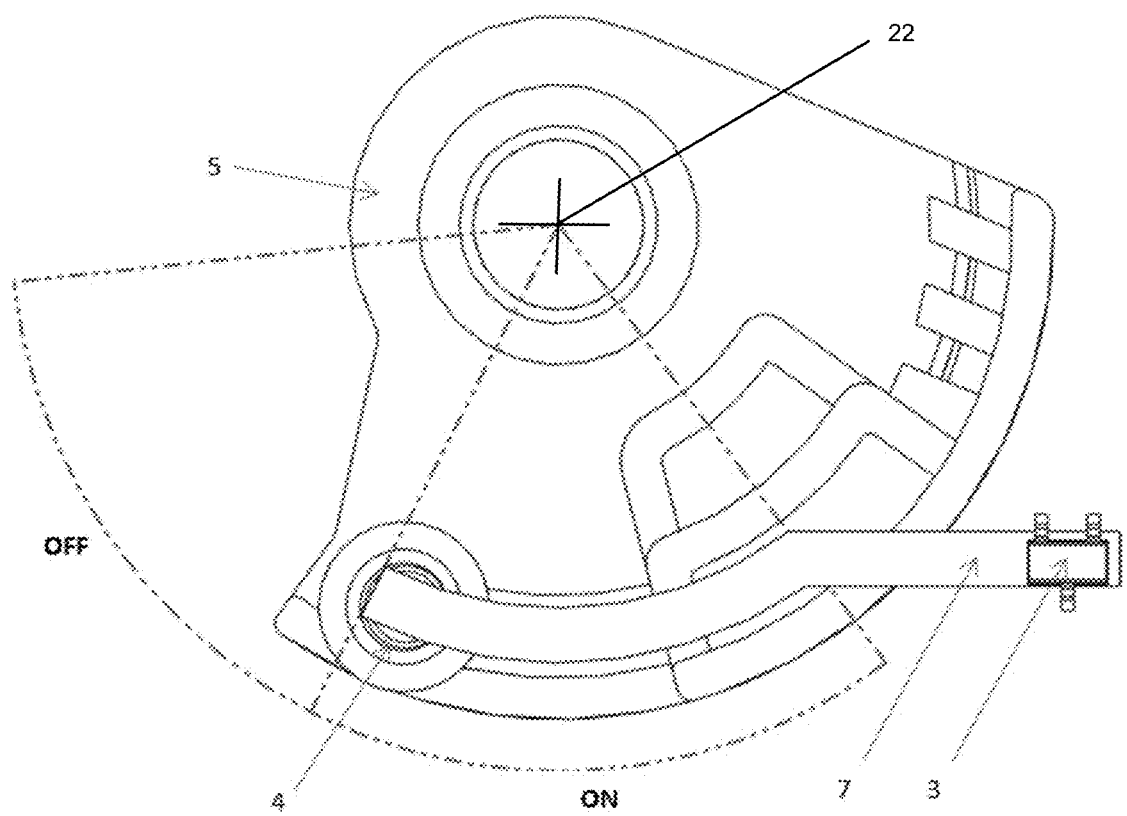

FIG. 9 shows the relationship between the metal traces 7, the hall-effect sensor 3, the magnets 4 and the levers 5 and how that correlates to the signals the controller sees. The magnet 4 transfers its magnetic field to the metal traces 7 any time it is under the metal traces 7, which then can activate the hall-effect sensors 3. This allows for the design and shape of the metal trace 7 to determine the activation range and signal timing for the switch.

Figure 10:
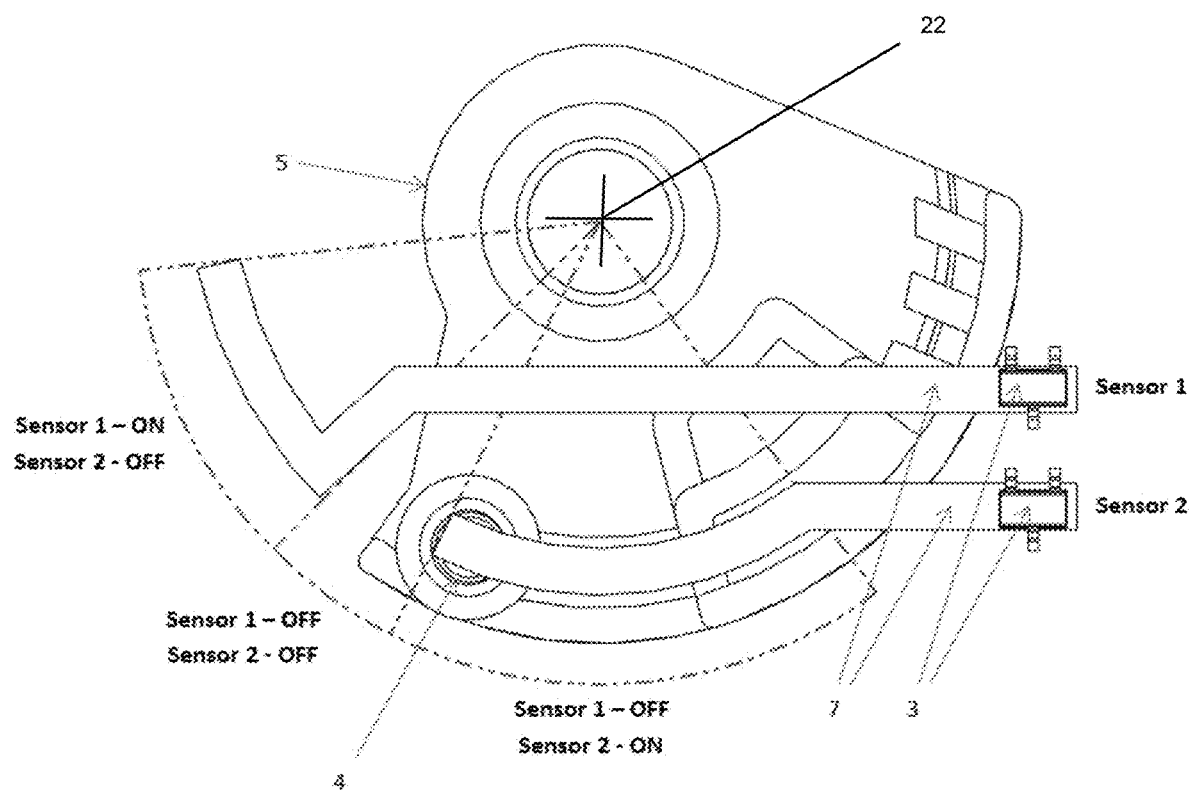

FIG. 10 shows the relationship between the metal traces 7, two hall-effect sensors 3, the magnets 4 and the levers 5 and how that correlates to the signals the controller sees. The magnet 4 transfers its magnetic field to the metal traces 7 any time it is under the metal traces 7, which then can activate the hall-effect sensors 3. As shown, a single magnet 4 and lever 5 can be capable of activating multiple hall-effect sensors 3 based on how the metal traces 7 are arranged.

Figure 11:
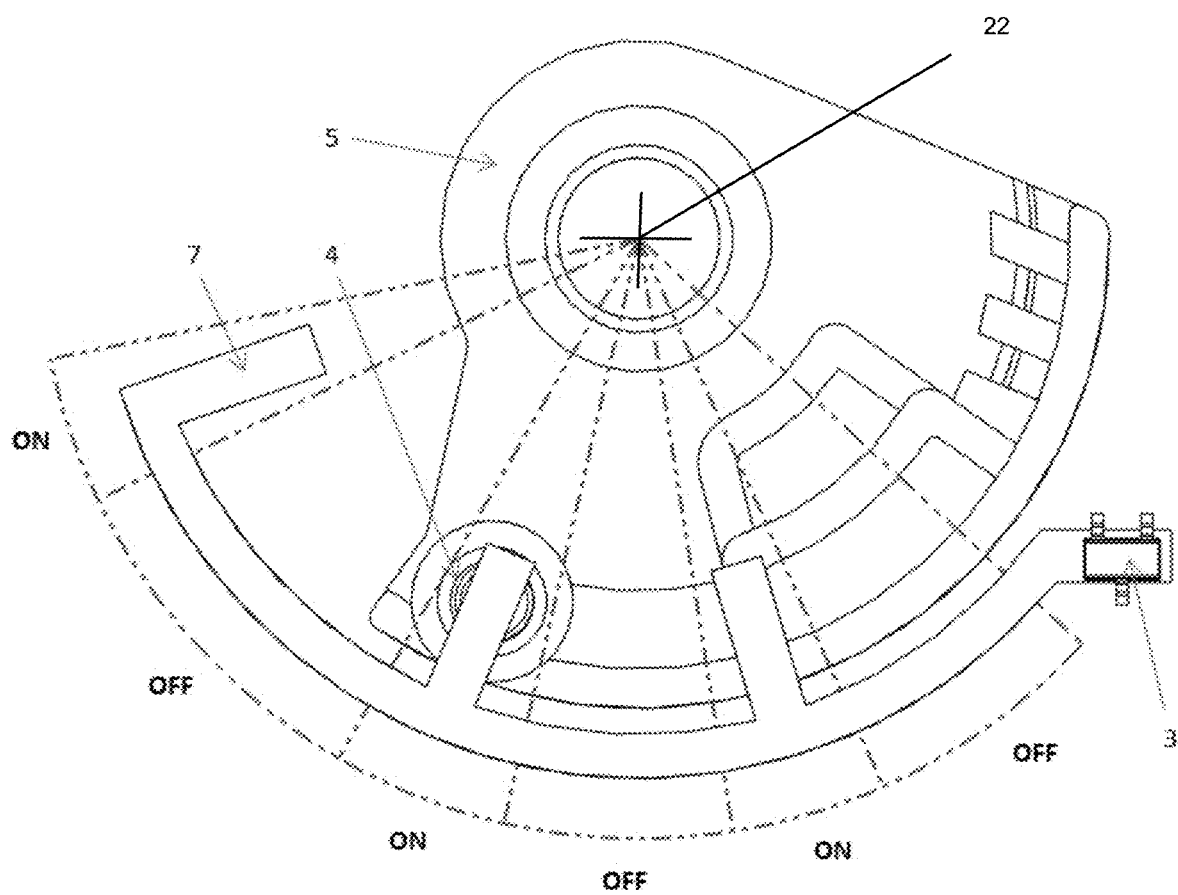

FIG. 11 shows the relationship between the metal traces 7, the hall-effect sensor 3, the magnets 4 and the levers 5 and how that correlates to the signals the controller sees. The magnet 4 transfers its magnetic field to the metal traces 7 any time it is under the metal traces 7, which then can activate the hall-effect sensors 3. As shown, a single magnet 4 and lever 5 can also be capable of having multiple activation points based on how the metal traces 7 are arranged. As illustrated, the metal traces 7 may be curved and have portions to be magnetized by the magnet 4. In other applications, multiple metal traces 7 may be configured for use with a single magnet 4. Still further the metal traces 7 may be horizontally and vertically arranged as well as curved to transfer the magnetic field(s) to the hall effect sensor(s) 3.

Figure 12A:
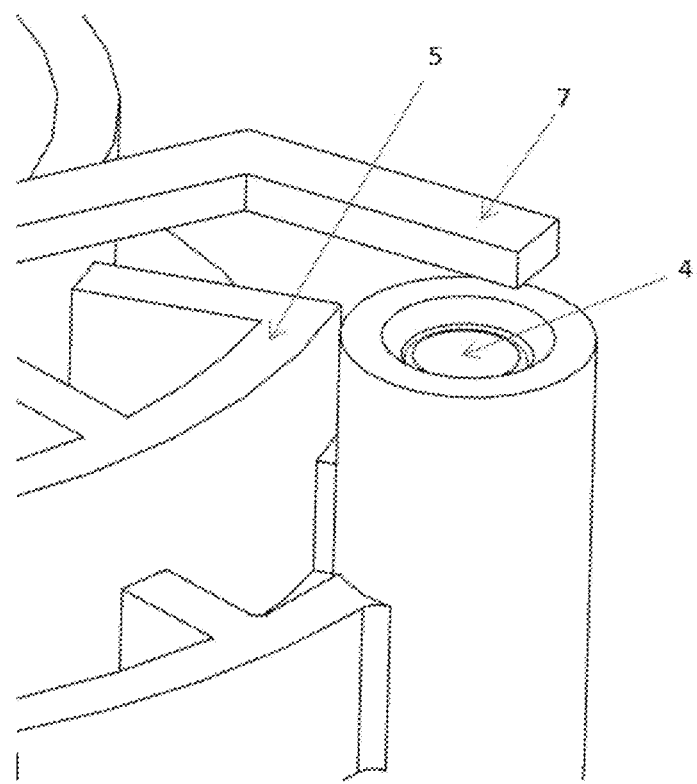
Figure 12B:
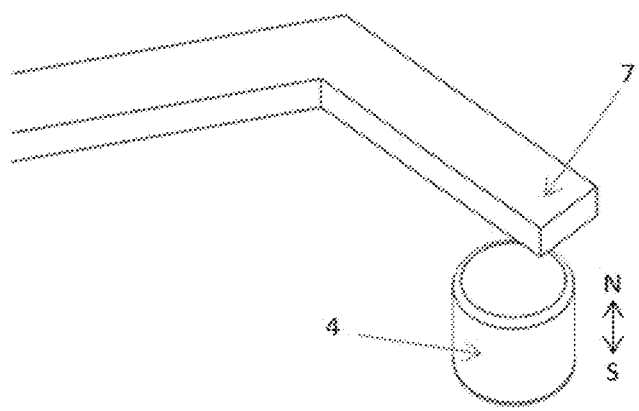

FIGS. 12A and 12B show the positional relationship between the metal trace 7, the magnet 4 and the lever 5. The magnet 4 activates the hall-effect sensor 3 anytime it is underneath the metal trace 7. In the orientation shown, the magnet's 4 pole is perpendicular to the metal trace 7.

Figure 13A:
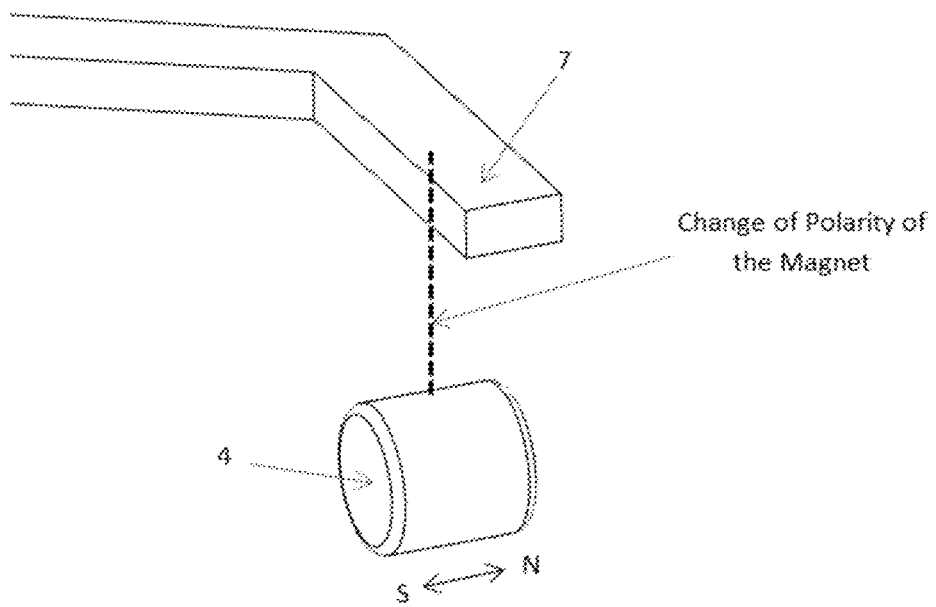
Figure 13B:
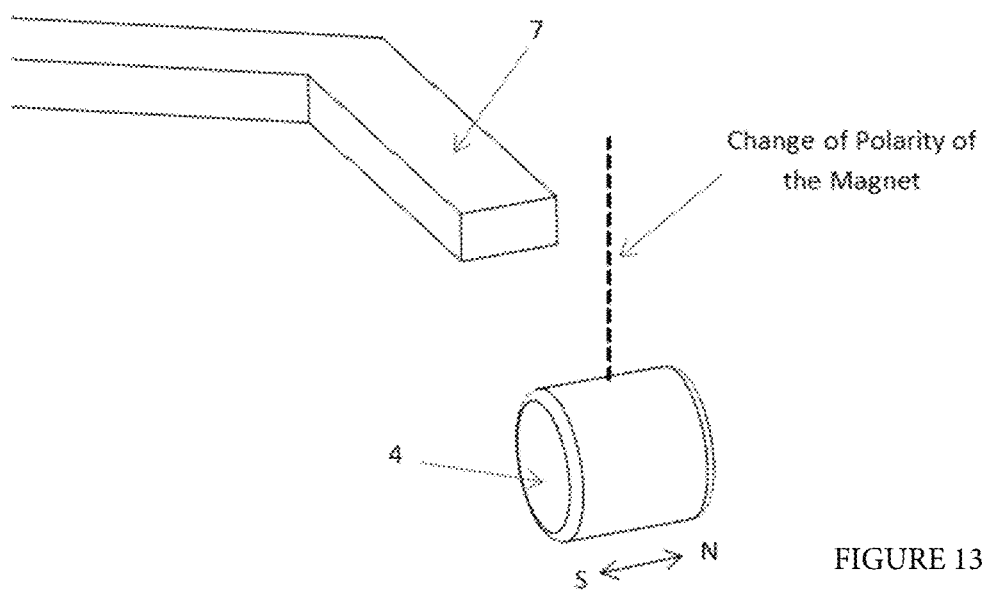

FIGS. 13A and 13B show the positional relationship between the metal trace 3, and the magnet 4 when the pole of the magnet 4 is horizontal to the metal trace 7. Since the hall-effect sensors 3 are designed to only activate when they see a magnet field of a specified polarity, the magnet 4 will only activate the hall-effect sensor 3 when the metal trace 7 is being magnetized by the correct polarity of the magnet 4. This allows for the magnet 4 to activate the sensor when whenever the metal trace 7 is in the correct field and transition to off once it switches to the opposite field. Therefore, in the event of any residual magnetic field remaining in the metal trace 7 (which would keep the switch on), the magnet 4 will re-magnetize the trace with the opposite polarity when it transitions underneath it, which will automatically turn the sensor to OFF.

The concepts disclosed herein may be used in any latching systems that require a printed circuit board PCB and hall-effect sensors.

In one embodiment, the hall effect sensors 3 are configured to provide signals indicative of the magnet's polarity or the magnetic field to the printed circuit board PCB 6. The printed circuit board PCB 6 will also have controller(s) or microcontroller(s) or microprocessor(s) (not shown) as well as the necessary electrical traces in order to operate the latch or latch assembly 20.

The PCB may also be referred to as a door latch controller or latch controller or electronic latch controller that comprises a microprocessor, microcontroller or other equivalent processing device capable of executing commands of computer readable data or program for executing a control algorithm that controls the operation of the latch or latch assembly. Moreover, the microprocessor, microcontroller or other equivalent processing device is capable of being programmed in order to provide the various control features described herein (e.g., door latch controller or latch controller or electronic latch controller and/or door unit controller).

In order to perform the prescribed functions and desired processing, as well as the computations therefore (e.g., the execution of fourier analysis algorithm(s), the control processes prescribed herein, and the like), the controller may include, but not be limited to, a processor(s), computer(s), memory, storage, register(s), timing, interrupt(s), communication interfaces, and input/output signal interfaces, as well as combinations comprising at least one of the foregoing. For example, the controller may include input signal filtering to enable accurate sampling and conversion or acquisitions of such signals from communications interfaces.

In addition and in other embodiments the PCB or door latch controller or electronic latch controller may also be configured to control other features of a vehicle door to which the latch or latch assembly is secured to. Non-limiting examples of these features include operation of a window regulator, side view mirrors, lighting, etc. As such, the PCB or door latch controller may also be configured to operate as door unit controller.

Since the PCB includes a microprocessor, microcontroller or other equivalent processing device it can be programmed to execute commands of computer readable data or a program for executing a control algorithm that controls the operation of the vehicle latch and/or other components of a vehicle door the latch or latch assembly is secured to. Therefore, the PCB may be configured to serve as a hub for other vehicle door electronics in addition to the operation of the latch or latch assembly.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An assembly for detecting the position of a moveable component of a latch assembly, comprising:
    a magnet secured to the moveable component, the moveable component being rotationally mounted to the latch assembly; and
    a hall effect sensor mounted on a printed circuit board remote from the magnet; and
    a metal trace mounted on the latch assembly, the metal trace in communication with the hall effect sensor, the metal trace being configured to define at least two separate portions that are separately magnetized by the magnet as the moveable movable component rotates in a first direction from a first position to a second position, wherein the at least two separate portions are configured such that the magnet can be located between the at least two separate portions wherein the at least two separate portions are not magnetized by the magnet.

2. The assembly as in claim 1, wherein the metal trace defines multiple activation points to be separately magnetized by the magnet.

3. The assembly as in claim 1, further comprising a connector secured to the printed circuit board.

4. The latch assembly as in claim 1, wherein a pole of the magnet is horizontal to the metal trace.

5. The latch assembly as in claim 1, wherein a pole of the magnet is perpendicular to the metal trace.

6. The latch assembly as in claim 1, wherein the metal trace is curved.

7. The latch assembly as in claim 1, wherein the magnet is a single magnet and the metal trace is configured to be magnetized at multiple discrete activation points by the single magnet.

8. An assembly for detecting the position of a moveable component of a latch assembly, comprising:
    a magnet secured to the moveable component, the moveable component being rotationally mounted to the latch assembly;
    a first hall effect sensor mounted on a printed circuit board and in communication with a first metal trace in a position remote from the magnet;
    a second hall effect sensor mounted on the printed circuit board and in communication with a second metal trace in a position remote from the magnet;
    wherein the first metal trace is magnetized by the magnet when the moveable movable component is in a first position and the second metal trace is magnetized by the magnet as the moveable movable component rotates in a first direction from the first position to a second position, wherein the first metal trace and the second metal trace are not magnetized by the magnet when moveable movable component is located between the first position and the second position.

9. The latch assembly as in claim 8, further comprising a connector secured to the printed circuit board.

10. A method for detecting movement of moveable component of a latch assembly, comprising:
    rotationally mounting the moveable component to the latch assembly;
    securing a magnet to the moveable component;
    locating a first hall effect sensor remote from the magnet, the first hall effect sensor being operably coupled to a latch controller;
    operably coupling a first metal trace to the first hall effect sensor;
    locating a second hall effect sensor remote from the magnet, the second hall effect sensor being operably coupled to the latch controller;
    operably coupling a second metal trace to the second hall effect sensor;
    wherein the first metal trace is magnetized by the magnet when the moveable component rotates is in a first position and the second metal trace is magnetized by the magnet when the moveable movable component rotates in a first direction from the first position to a second position, wherein the first metal trace and the second metal trace are not magnetized by the magnet when the moveable component is located between the first position and the second position.

11. The method as in claim 10, further comprising a connector secured to the controller.

12. The method as in claim 10, wherein a pole of the magnet is horizontal to the first metal trace and the second metal trace.

13. The method as in claim 10, wherein a pole of the magnet is perpendicular to the first metal trace and the second metal trace.

* * * * *